United States Patent
Yoon et al.

(10) Patent No.: US 8,847,362 B2
(45) Date of Patent: Sep. 30, 2014

(54) STRUCTURE OF THIN NITRIDE FILM AND FORMATION METHOD THEREOF

(75) Inventors: Euijoon Yoon, Seoul (KR); Kookheon Char, Seoul (KR); Jong Hak Kim, Seoul (KR); Sewon Oh, Seoul (KR); Heeje Woo, Seoul (KR)

(73) Assignee: SNU R&DB Foundation, Seoul (KR)

( * ) Notice: Subject to any disclaimer, the term of this patent is extended or adjusted under 35 U.S.C. 154(b) by 118 days.

(21) Appl. No.: 13/062,557

(22) PCT Filed: Sep. 7, 2009

(86) PCT No.: PCT/KR2009/005055
§ 371 (c)(1),
(2), (4) Date: Mar. 7, 2011

(87) PCT Pub. No.: WO2010/027230
PCT Pub. Date: Mar. 11, 2010

(65) Prior Publication Data
US 2011/0156214 A1   Jun. 30, 2011

(30) Foreign Application Priority Data

Sep. 8, 2008  (KR) .................. 10-2008-0088044
Sep. 4, 2009  (KR) .................. 10-2009-0083292

(51) Int. Cl.
*H01L 29/20*   (2006.01)
*H01L 21/02*   (2006.01)
*H01L 33/00*   (2010.01)

(52) U.S. Cl.
CPC ...... *H01L 21/0237* (2013.01); *H01L 21/02647* (2013.01); *H01L 33/007* (2013.01); *H01L 21/02505* (2013.01); *H01L 21/02639* (2013.01); *H01L 21/0254* (2013.01); *H01L 21/02458* (2013.01); *H01L 21/02507* (2013.01)
USPC ..................... 257/615; 257/E21.09

(58) Field of Classification Search
USPC ............. 257/615, E29.089, E21.09; 438/478
See application file for complete search history.

(56) References Cited

U.S. PATENT DOCUMENTS

2005/0077512 A1   4/2005   Yoon et al.
2006/0216849 A1   9/2006   Letertre et al.
(Continued)

FOREIGN PATENT DOCUMENTS

CN   1413357 A   7/2001
CN   1607683 A   4/2005
(Continued)

OTHER PUBLICATIONS

Wang-Nang Wang, GaN epitaxial layer over growth method, Aug. 13, 2008.

*Primary Examiner* — Vongsavanh Sengdara
(74) *Attorney, Agent, or Firm* — William Park & Associates Patent Ltd.

(57) ABSTRACT

Provided are a nitride thin film structure and a method of forming the same. If a nitride thin film is formed on a substrate that is not a nitride, many defects are generated by a difference in lattice constants between the substrate and the nitride thin film. Also, there is a problem of warping the substrate by a difference in thermal expansion coefficients between the substrate and the nitride thin film. In order to solve the problems, the present invention suggests a thin film structure in which after coating hollow particles, i.e. hollow structures on the substrate, the nitride thin film is grown thereon and the method of forming the thin film structure. According to the present invention, since an epitaxial lateral overgrowth (ELO) effect can be obtained by the hollow structures, high-quality nitride thin film can be formed. Since a refractive index in the thin film structure is adjusted, there is an effect of increasing light extraction efficiency during manufacturing the thin film structure into a light emitting device such as a light emitting diode (LED). Also, when thermal expansion coefficient of the substrate is greater than that of the nitride thin film, total stress of the nitride thin film is decreased according to the compression of the hollow structures in the nitride thin film such that there is also an effect of preventing warpage of the substrate.

10 Claims, 10 Drawing Sheets

(56) References Cited

U.S. PATENT DOCUMENTS

| | | |
|---|---|---|
| 2006/0270201 A1 | 11/2006 | Chua et al. |
| 2006/0278880 A1* | 12/2006 | Lee et al. ................ 257/79 |
| 2007/0072396 A1 | 3/2007 | Feltin et al. |
| 2007/0141741 A1 | 6/2007 | Suh et al. |
| 2008/0050599 A1 | 2/2008 | Morita et al. |
| 2009/0111250 A1* | 4/2009 | Lee et al. ................ 438/483 |

FOREIGN PATENT DOCUMENTS

| | | |
|---|---|---|
| CN | 1745468 A | 3/2006 |
| KR | 100638880 B1 | 10/2006 |
| KR | 100744933 B1 | 7/2007 |

* cited by examiner

FIG. 3
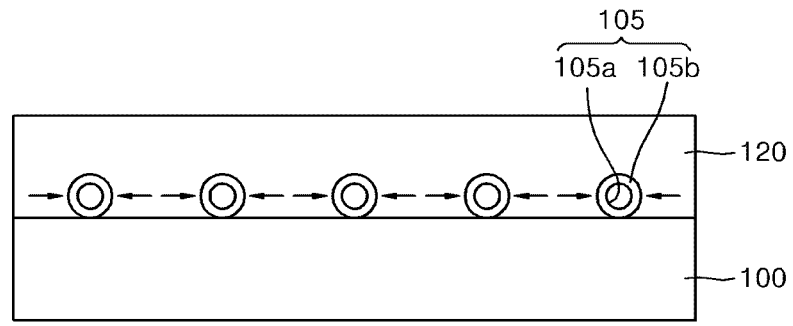
FIG. 4
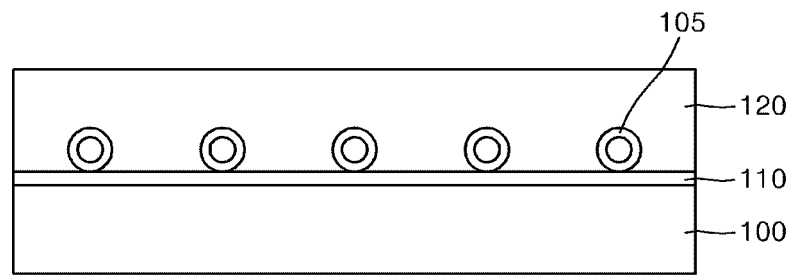
(a)
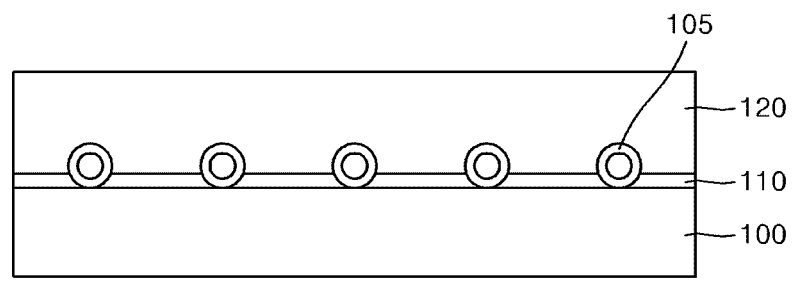
(b)

(a)            (b)

(a)            (b)

STRUCTURE OF THIN NITRIDE FILM AND FORMATION METHOD THEREOF

TECHNICAL FIELD

The present invention relates to a compound semiconductor layer composed of gallium nitride (GaN) or a mixed nitride of gallium and other metals, and a method of forming the compound semiconductor layer. The present invention also relates to an electronic or an opto-electronic device including the compound semiconductor layer and a manufacturing method thereof. The technical field of the present invention may be widely defined as a nitride thin film structure forming a high-quality nitride thin film on a substrate and a method of forming the nitride thin film structure.

BACKGROUND ART

Nitride semiconductors of the group III through group V elements in the periodic table are already occupying an important position in the fields of electronic and opto-electronic devices, and these fields will be more important in the future. Application areas of the nitride semiconductors substantially cover a wide range from a laser diode (LD) to a transistor operable at high frequency and high temperature. The application areas also include an ultraviolet photodetector, a surface acoustic wave device, and a light emitting diode (LED).

For example, although gallium nitride is known as a material suitable to be applied to a blue LED and a high-temperature transistor, it is being widely studied for applications of microelectronic devices which are not limited thereto. Also, as described herein, gallium nitride may be widely used by including gallium nitride alloys such as aluminum gallium nitride (AlGaN), indium gallium nitride (InGaN), and aluminum indium gallium nitride (AlInGaN).

An important technology in manufacturing of the gallium nitride microelectronic devices is to grow a gallium nitride thin film having low defect density. It is known that one of factors producing the defect density is due to a substrate where the gallium nitride thin film is grown. However, it is not easy to manufacture a substrate for growing gallium nitride or a gallium nitride substrate which is appropriate for growing a defect-free gallium nitride thin film in these devices. Since solid gallium nitride is not melted well even if heated, a single crystal to be used for manufacturing the substrate is unable to be made by a conventional Czochralski method or the like in which crystals are grown from a melt. The melt may be made by applying heat under ultra-high pressure state; however, there is a difficulty in applying this in terms of mass production.

Therefore, in devices using nitride semiconductors like gallium nitride, substrates, which are most frequently used for growing nitride thin films, are "foreign" substrates such as sapphire, silicon carbide (SiC), and silicon. However, since these foreign substrate materials have lattice constant mismatch and a difference in thermal expansion coefficient from nitride, a nitride thin film grown on the foreign substrate has many dislocations, causing crack and warpage to be generated.

Lattice parameters (a-axis and c-axis) and thermal expansion coefficients (a-axis and c-axis) between typical nitride semiconductors, e.g. GaN, AlN, and InN, and a typical foreign substrate, e.g. sapphire ($Al_2O_3$) are presented in Table 1.

TABLE 1

| | a (Å) | c (Å) | $\alpha_a$ ($10^{-6} K^{-1}$) | $\alpha_c$ ($10^{-6} K^{-1}$) |
|---|---|---|---|---|
| GaN | 3.189 | 5.185 | 5.59 | 7.75 |
| AlN | 3.111 | 4.98 | 5.3 | 4.2 |
| InN | 3.545 | 5.703 | 5.7 | 3.7 |
| $Al_2O_3$ | 4.758 | 12.99 | 7.3 | 8.5 |

As shown in the above Table 1, since there are differences in the lattice parameters and the thermal expansion coefficient between the nitride semiconductor and the sapphire, it is difficult to grow a high-quality nitride thin film. Typical problems include that dislocation density is $10^7/cm^2$ or more during growth of a nitride thin film on a sapphire substrate, and there is a phenomenon of substrate warpage due to the difference in the thermal expansion coefficient. FIG. 1 is a schematic view illustrating warpage of a substrate 10 generated during cooling (see FIG. 1 (b)) after growing a GaN thin film 15 having a lower thermal expansion coefficient at high temperature on a sapphire substrate having a larger thermal expansion coefficient than the GaN thin film (see FIG. 1(a)).

In order to minimize the problems of such defects and substrate warpage, various buffer layers are formed on the substrate before the growth of a nitride thin film, or an epitaxial lateral overgrowth (ELO) method is being used. The conventional ELO method uses a stripe-type silicon dioxide ($SiO_2$) mask. The conventional ELO method will be described with reference to FIG. 2, a cross-sectional view of a thin film structure to which the conventional ELO method is applied.

In the conventional ELO method, after growing a nitride thin film 25 on a substrate 20 in a growth furnace, the substrate 20 with the grown nitride film 25 is taken out from the growth furnace. Subsequently, the substrate 20 is charged into deposition equipment to deposit a $SiO_2$ thin film on the nitride thin film 25, and the substrate 20 with the deposited $SiO_2$ thin film is then taken out from the deposition equipment. After forming a $SiO_2$ mask 30 by patterning the $SiO_2$ thin film using a photolithography technique, an ELO nitride thin film 35 is grown by charging the resultant substrate 20 again into the growth furnace.

A laterally grown portion above the $SiO_2$ mask 30 in the ELO nitride thin film 35 has higher quality than a vertically grown portion because defects such as dislocations or the like are not propagated. Therefore, excellent properties can be achieved if a device is fabricated using the laterally grown ELO nitride thin film 35 as an active layer.

However, the ELO method has problems in that an additional external process is required according to the foregoing complex process, i.e. the process of forming the $SiO_7$ mask, the process takes a long time and cost increases. Also, as the $SiO_2$ mask is formed in a multilayered form in order to improve and add functions of the ELO at present, the forming process of the $SiO_2$ mask and the growth process of the nitride thin film are increased in proportion to the number of the $SiO_2$ masks. Therefore, the cost and process complexity are more increased, thus leading to a decrease in production yield as well as temporal and economic losses.

Also, a difference in refractive index between the foreign substrate and the nitride thin film causes a problem that photons generated in the device are unable to escape to the outside and trapped inside the device. Recently, a patterned sapphire substrate (PSS) method is widely used in order to increase light extraction efficiency. The PSS method is to form patterns in a sapphire substrate itself through a photolithography process. However, since photo and etching processes are required, there are disadvantages that cost is increased and process becomes complex. Also, there is a problem in that this will be a cause of defects by generating damage of the substrate itself due to the substrate etching.

Recently, a method, in which a substrate is coated with spherical particles and a nitride thin film is grown thereon to reduce dislocation density, was reported. Although there is an advantage of reducing the dislocation density when the substrate is coated with the spherical particles and the nitride thin film is grown thereon, there exists a limit in light extraction efficiency because refractive index of the spherical particle is greater than 1. Also, there is a limitation in reducing the stress received by the nitride thin film in the case of the spherical particle with a filled core.

DISCLOSURE

Technical Problem

The present invention provides a thin film structure which can form a high-quality nitride thin film by reducing stress of the nitride thin film and decreasing dislocations during growing of the nitride thin film having a different lattice constant or thermal expansion coefficient from a substrate, and a method of forming the thin film structure.

Technical Solution

According to an exemplary embodiment, a thin film structure includes: a substrate on which a plurality of hollow structures coated; and a nitride thin film formed over the substrate. In the present invention, a hollow structure denotes as a wide meaning including a hollow particle. Since the nitride thin film formed over the hollow structures is in high quality with low defect density, a nitride semiconductor device, which emits lights of infrared, ultraviolet, and visible ray regions, can be manufactured by using the foregoing nitride thin film.

According to another exemplary embodiment, a method of forming the nitride thin film structure includes: coating a plurality of hollow structures on a substrate; and forming a nitride thin film over the substrate.

Advantageous Effects

In the present invention, since a nitride thin film is grown from a surface of a substrate exposed at a periphery of hollow structures by coating the substrate with the hollow structures, an ELO effect caused by the hollow structures can be obtained. Therefore, a high-quality thin film having low defect density can be formed.

There is also an effect in which the hollow structures control refractive index in a thin film structure. The hollow structures make the refractive index difference with respect to the substrate large such that generated photons come out more efficiently. Thus, light extraction efficiency is increased if the thin film structure of the present invention is made into a light emitting device such as a light emitting diode (LED).

Also, when thermal expansion coefficient of the substrate is larger than that of the nitride thin film, total stress of the nitride thin film is decreased according to the compression of the hollow structures in the nitride thin film. Therefore, there is also an effect of preventing warpage of the substrate.

As a result, since a nitride semiconductor epitaxial layer with excellent physical properties can be grown, an optoelectronic device having high efficiency and high reliability can be achieved. Also, high-power laser diode (LD) and LED can be achieved due to the increase in light extraction efficiency.

DESCRIPTION OF DRAWINGS

Exemplary embodiments can be understood in more detail from the following description taken in conjunction with the accompanying drawings, in which:

FIG. 3 is a cross-sectional view illustrating a nitride thin film structure according to an exemplary embodiment;

FIG. 4(a) is a cross-sectional view illustrating a nitride thin film structure according to another exemplary embodiment, and FIG. 4(b) is a cross-sectional view illustrating a nitride thin film structure according to another exemplary embodiment;

BEST MODE

Figure 1:
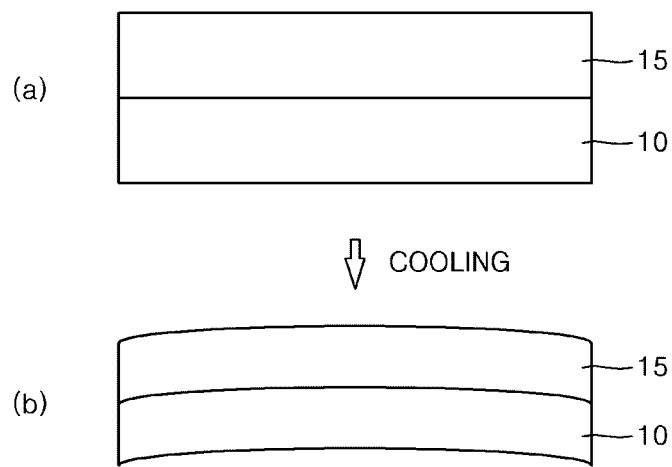
FIG. 1 illustrates warpage of a substrate in a nitride thin film structure formed by a conventional method.
Figure 2:
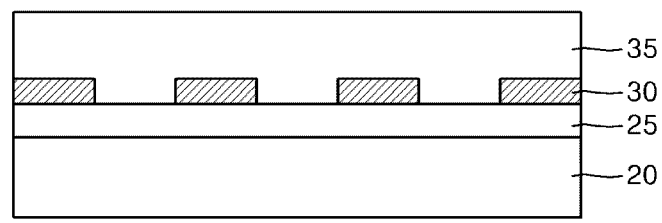
FIG. 2 illustrates a conventional epitaxial lateral overgrowth (ELO) method.

The present invention also suggests a thin film structure including a substrate, a hollow structure coated thereon, and a buffer layer enabling to minimize defect density between the substrate and a nitride thin film. The nitride thin film may be composed of two or more layers. For example, the nitride thin film in the thin film structure of the present invention is composed of a first nitride thin film, a second nitride thin film, a third nitride thin film or the like. The first nitride thin film is formed on the buffer layer and the hollow structure coated on the substrate, the second nitride thin film is formed on the first nitride thin film, and the third nitride thin film may be formed on the second nitride thin film. Also, additional hollow structures may be further included between the first and second nitride thin films, and between the second and third nitride thin films. The nitride thin films, which are composed of two or more layers like the above, may be the same kind or different kind from each other.

When the hollow structure is composed of many layers like the above, a method, in which a difference in refractive index is adjusted by controlling hollow size or coating density of the hollow structure, is also included in the present invention. For example, a first hollow structure having a large hollow size is coated for forming the first nitride thin film, the second nitride thin film is formed after coating with a second hollow structure having a smaller hollow size on the first nitride thin film, and the third nitride thin film is formed after coating with a hollow structure having a smallest hollow size on the second nitride thin film. If performed as the above, a ratio occupied by the hollow with respect to a predetermined area will be increased as closer toward the substrate. Since a gas having a small refractive index is trapped in the hollow, the refractive index is gradually decreased as the ratio occupied by the hollow is increased.

It is preferable that the hollow structure used in the present invention is a material having a difference in the refractive index from the nitride thin film. Since the gas is trapped in the hollow, the refractive index difference between the nitride thin film and the hollow structure can be obtained even if an outer wall material is the same as the nitride thin film. Also, the refractive index difference between the nitride thin film and the hollow structure can be obtained even if the outer wall material is different from the nitride thin film. The hollow structure may have various shapes such as a sphere, a hexahedron or the like, and its size may be 10 nm-100 μm that can be variously used. In case of the outer wall surrounding the hollow of the hollow structure, the hollow structure, in which thickness of the entire outer wall including thicknesses of both ends is 3-50% of the size (total diameter) of the hollow structure, is used. Also, when the refractive index is adjusted by controlling the size of the hollow structure, the outer wall thicknesses of the hollow structures having different sizes from each other may have the same thickness ratio on the whole. In order to further increase the ratio occupied by the hollow with respect to the predetermined area toward the substrate, the size of the hollow may be larger in a way that the outer wall thickness becomes thinner although the size of the hollow structure is the same as closer toward the substrate.

When the nitride thin film is formed, it is good to make the hollow structure electrostatically attach on the substrate by allowing the substrate and the hollow structure to have electric charges different from each other.

Particularly, the coating of the hollow structure may include coating a plurality of core-shell structures on the substrate, and forming a hollow structure by remaining a shell portion of the core-shell structure and removing a core portion. In an exemplary embodiment, the core portion of the core-shell structure is a bead manufactured with an organic material or an inorganic material. The shell portion is formed of at least one of silica ($SiO_2$), alumina ($Al_2O_3$), titania ($TiO_2$), zirconia ($ZrO_2$), yttria ($Y_2O_3$)-zirconia, copper oxide (CuO, $Cu_2O$), and tantalum oxide ($Ta_2O_5$), and is composed of a single layer or a multi-layered structure.

After the coating of the core-shell structures, the hollow structures can be obtained by removing the core portions by a method in which the core portion of the core-shell structure is decomposed by heating, or generating a chemical reaction with a gas including oxygen, or using a solvent. Also, after the coating of the core-shell structures, a post-processing such as heating for controlling mechanical properties of the hollow structure, e.g. plastic property, elastic property or the like, may be further included.

Even when the core-shell structure is utilized as the above, it is also good to make the hollow structure electrostatically attach on the substrate by allowing the substrate and the hollow structure to have electric charges different from each other. The core-shell structure is coated on the substrate by dispersing in a solvent. Coating density of the core-shell structure may be adjusted by controlling at least any one of electric charge strengths of the substrate and the core-shell structure and concentration of the solvent.

In order for the substrate and the core-shell structure to have different electric charges from each other, it is preferable that an electrically charged structure is selected as the core-shell structure, and a polymer electrolyte is coated on the substrate in order for the substrate to have a different electric charge from the core-shell structure to each other. It is preferable that poly(allylamine hydrochloride) (PAH) and poly (sodium 4-styrene-sulfonate) (PSS) are coated as the polymer electrolyte by a layer-by-layer method.

Particularities of other exemplary embodiments are included in the detailed description and drawings.

Mode for Invention

Hereinafter, specific embodiments will be described in detail with reference to the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements, and thus their description will be omitted.

FIG. 3 is a cross-sectional view illustrating a nitride thin film structure according to an exemplary embodiment.

Referring to FIG. 3, a plurality of hollow structures 105 are coated on a substrate 100, and a high-quality nitride thin film 120 is formed, in which the layer is formed by growing over the substrate 100 exposed at a periphery of the hollow structure 105 to be combined over the hollow structure 105. A nitride semiconductor device may be manufactured using the above structure, in which lights of ultraviolet, visible, and infrared ray regions can be emitted by controlling a bandgap depending on a kind of materials for the nitride thin film 120.

All foreign substrates such as alumina ($Al_2O_3$), silicon (Si), silicon carbide (SiC), and gallium arsenide (GaAs) substrates, etc., which are used for growing heteroepitaxial thin films of semiconductor materials, may be used as the substrate 100. The nitride thin film 120 includes all nitride semiconductor materials such as gallium nitride (GaN), indium nitride (InN), aluminum nitride (AlN), or $Ga_xAl_yIn_zN$ (0<x, y, z<1) which is a combination thereof, etc.

The hollow structure 105 has a hollow particle shape in which an outer wall 105b with a predetermined thickness surrounds a hollow 105a with a predetermined size. A material for the outer wall 105b may be the same as or different from the nitride thin film 120, and may be a metal oxide or a metallic material such as silica ($SiO_2$), alumina ($Al_2O_3$), titania ($TiO_2$), zirconia ($ZrO_2$), yttria ($Y_2O_3$)-zirconia, copper oxide (CuO, $Cu_2O$), and tantalum oxide ($Ta_2O_5$), etc. Although the hollow structure 105 may be composed of any single layer of these materials, the hollow structure 105 may have a multi-layered structure where the respective layers may be formed of different materials.

Since the hollow structure 105 is a structure having a hollow therein, it is easily compressed such that it shows an effect of reducing total stress when compressive stress is exerted on the nitride thin film 120. In order to maximize the above effect, it is advantageous that the material for the outer wall 105b of the hollow structure 105 is selected with a material having excellent plastic and/or elastic property. Since a deformation degree of the hollow structure 105 will be different from a material of the hollow structure, size of the hollow, thickness of the outer wall (the size of the hollow structure=the size of the hollow+the thickness of the outer wall×2), it is appropriate that these variables are determined to have a proper stress reducing effect depending on the kinds of the substrate 100 and nitride thin film 120. Although the hollow structure 105 may have a size in the range of 10 nm to 100 μm, it is not limited thereto. Although, in the case of the outer wall of the hollow structure 105, the hollow structure 105 may be used in which thickness of the entire outer wall including thicknesses of both ends is 3-50% of the size (total diameter) of the hollow structure, but it is not limited thereto.

In the case of the nitride thin film 120, general growth temperature is in the range of 1000° C. to 1100° C., which is very high as compared to the other materials. Therefore, if a difference in thermal expansion coefficients exists between the substrate 100 and the nitride thin film 120, the substrate 100 will be bent because a degree of shrinkage is different from the substrate 100 at a lower position and the nitride thin film 120 at an upper position when cooling down to room temperature after growing.

The thermal expansion coefficient of the substrate 100 is much larger than that of the nitride thin film 120 when the substrate 100 is made of sapphire. As a result, compressive stress will be exerted on the nitride thin film 120. Therefore, the compressive stress is generated in the nitride thin film 120, and on the contrary, tensile stress may be generated in the substrate 100. The hollow structure 105 used in the present invention is compressed by the stress generated in the nitride thin film 120 as shown by arrows in FIG. 3, thereby enabling to reduce the total stress generated in the nitride thin film 120.

Also, in the nitride thin film 120, since defects such as dislocations do not propagate in a portion grown over the hollow structure 105 in a transverse direction as compared to a portion grown in a vertical direction, the portion grown in a transverse direction is in high quality such that the hollow structure 105 gives an ELO effect. Therefore, the nitride thin film 120 becomes a film for a high-quality device having low dislocation density.

During forming of the nitride thin film 120, there is a case where a buffer layer is formed using a two-step growth method. Referring to FIG. 4(a) relating to another exemplary embodiment of the present invention, a buffer layer 110 is first formed on a substrate 100, and a plurality of hollow structures 105 are coated thereon. A nitride thin film 120 is formed over the buffer layer 110. Also, referring to FIG. 4(b) relating to another exemplary embodiment of the present invention, a plurality of hollow structures 105 are coated on a substrate 100, a buffer layer 110 is formed between the hollow structures 105. A nitride thin film 120 is formed thereon. Thus, thin film structures shown in FIGS. 4(a) and 4(b) further include the buffer layers 110 between the substrates 100 and the nitride thin films 120.

The buffer layer is formed to minimize crystal defect density of the nitride thin film 120 by reducing crystallographic difference between the substrate 110 and the nitride thin film 120. The buffer layer 110 and the nitride thin film 120 may be formed to include one or more element such as iron (Fe), magnesium (Mg), oxygen (O), and silicon (Si) which are foreign elements that can be doped into nitrides. This is similarly applied to all other exemplary embodiments hereinafter. The buffer layer 110 may be formed of GaN or AlN, and the nitride thin film 120 may be formed at a higher temperature than or a similar temperature to the growth temperature according to growth temperature of the buffer layer.

Figure 5:
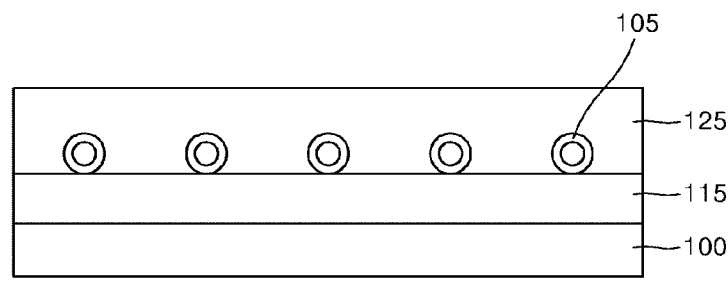
FIG. 5 is a cross-sectional view illustrating a nitride thin film structure according to another exemplary embodiment.

A structure illustrated in FIG. 5 is also possible as another exemplary embodiment of the present invention. A first nitride thin film 115 is first formed on a substrate 100. A buffer layer, which is not illustrated, may exist between the first nitride thin film 115 and the substrate 100. Hollow structures 105 are provided on the first nitride thin film 115. A second nitride thin film 125 is formed on the hollow structures 105 and the first nitride thin film 115. The first nitride thin film 115 and second nitride thin film 125 may be formed of the same nitrides and may be formed of different kinds of nitrides from each other. Thus, the nitride thin film may be composed of two or more layers.

The ELO effect, stress reduction effect, and substrate warpage prevention, which are obtained by the hollow structures 105, are also maintained in the structures of FIGS. 4 and 5. Thus, if a structure is coated with the hollow structure 105 regardless of a position of the hollow structure 105, presence and position of the buffer layer 110, and presence of a multilayer in the nitride thin film, the object of the present invention can be achieved.

Figure 6:
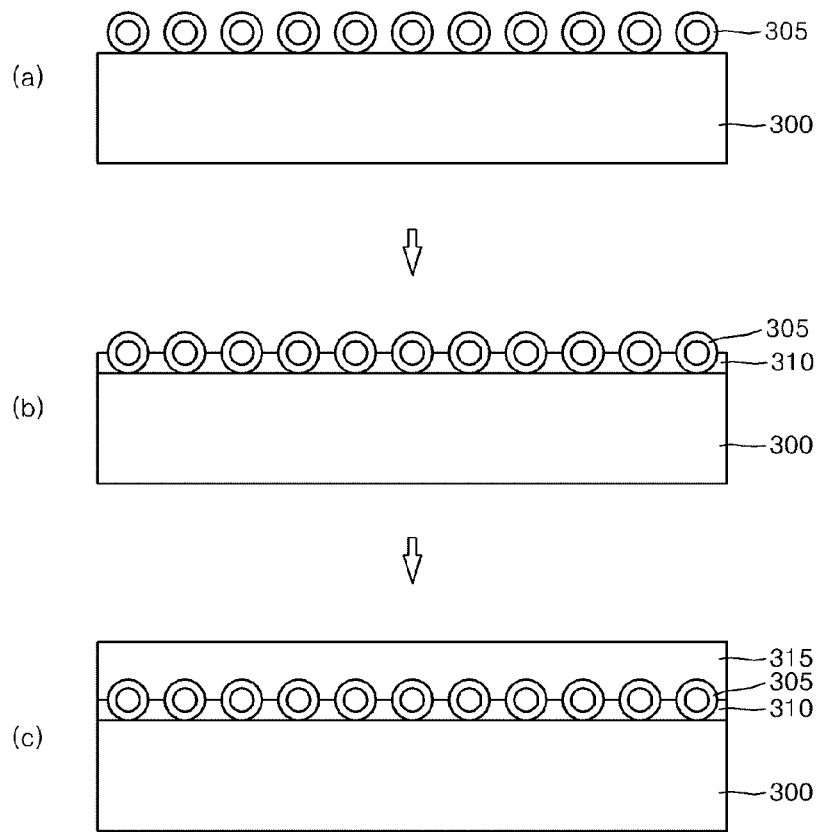
FIG. 6 is a cross-sectional view illustrating a method of forming a nitride thin film structure according to another exemplary embodiment.

FIG. 6 is a cross-sectional view illustrating a method of forming a nitride thin film structure according to another exemplary embodiment, in which the method is also capable of obtaining the thin film structure as shown in FIG. 4 (b).

Referring to FIG. 6(a), spherical structures 305 are coated on a substrate 300. A dip coating or a spin coating may be used as a coating method. The dip coating and spin coating are wet methods using solutions in the state where the spherical hollow structures are dispersed in appropriate solvents. A coating density of the hollow structures 305 on the substrate 300 may be adjusted by controlling a coating condition such as concentration of the solvent. When the quantity of the spherical hollow structures 305 is larger than that of the solvent, higher coating density can be obtained than in the opposite case.

Particularly, if the spherical hollow structures 305 are made to electrostatically attach on the substrate 300 by allowing the substrate 300 and the hollow structures 305 to have electric charges different from each other, it is advantageous that the coating state is hardly changed because there is no concern that the once attached spherical hollow structures are likely to be detached. At this time, it is possible to adjust the electric charge strengths of the substrate 300 and spherical hollow structures 305 for controlling the coating density. The larger the electric charge strength becomes, the higher the coating density may be obtained.

Subsequently, as shown in FIG. 6(b), a buffer layer 310 is formed on the substrate 300 of which a surface is exposed at a periphery of the spherical hollow structure 305. A low-temperature buffer layer like GaN may have a thickness enough to induce lattice relaxation in a wide range, i.e., the thickness range of 10-100 nm. A temperature range of a surface reaction controlled section in a general chemical vapor deposition (CVD) method may be used in the forming of the buffer layer 310, wherein the temperature range of 400° C. to 700° C. may be used if a GaN layer is grown on a sapphire substrate. The buffer layer composed of AlN may be formed in a temperature range higher than the above temperature range. Various deposition methods (beam evaporators, sublimation sources, and a Knudsen cell), ion beam deposition methods, and vapor-phase epitaxy methods (atomic layer epitaxy (ALE), chemical vapor deposition (CVD), atmospheric pressure chemical vapor deposition (APCVD), plasma-enhanced chemical vapor deposition (PECVD), rapid thermal chemical vapor deposition (RTCVD), ultrahigh vacuum chemical vapor deposition (UHVCVD), low-pressure chemical vapor deposition (LPCVD), metal-organic chemical vapor deposition (MOCVD), and gas source molecular beam epitaxy (GSMBE), etc.) may be used as a method for growing the buffer layer 310.

In order to grow the buffer layer 310 in the present exemplary embodiment, the substrate 300 coated with the spherical hollow structures 305 is first charged into a reactor. Next, pressure, temperature, and a ratio of a group V precursor to a group III precursor of the reactor are made to be constant. The pressure, temperature, and the ratio of the group V precursor to the group III precursor of the reactor may be in the ranges of 10-1000 torr, 300-1200° C., and 1-1000000, respectively. When the reactor is stabilized, the buffer layer 310 is obtained by injecting the group V and group III precursors at a constant rate to grow the nitride layer on the substrate 300. The injecting of the group V and group III precursors is maintained until the buffer 310 having a predetermined thickness is obtained.

Subsequently, as illustrated in FIG. 6(c), the nitride thin film 315 is grown on the buffer layer 310. Thickness of the nitride thin film 315 may be selected in the wide range of 100 nm to 1 mm depending on a function as an active layer in a device manufactured thereafter. If necessary, the nitride thin film 315 may be formed to have the conductive type of a p-type and/or an n-type by adding appropriate doping elements, and may be formed to have a structure where an undoped layer is further combined with the doped layer by stop adding the doping elements. A temperature range of a mass transfer controlled section may be used as a growth temperature of the nitride thin film like a GaN high-temperature epitaxial layer, wherein the temperature range of 700° C. to 1200° C. may be used during growing a GaN layer on a sapphire substrate, and the temperature is controlled to be equal to or higher than the growth temperature of the buffer layer.

The forming of the buffer layer 310 and the forming of the nitride thin film 315 in the above may be performed in one chamber or in two processing chambers connected with a transfer chamber without breaking a vacuum state (or by in-situ).

When performing in-situ in one chamber, the buffer layer 310 is formed as illustrated in FIG. 6(b), and thereafter, the pressure, temperature and ratio of the group V precursor to the group III precursor of the reactor are made to be constant with the appropriate condition for growing the nitride thin film 315. The pressure, temperature, and ratio of the group V precursor to the group III precursor of the reactor may be properly selected in the same range as the case of the forming of the buffer layer 310, and may be performed with the same condition as the case of the forming of the buffer layer 310. A nitride layer is grown over the buffer layer 310 by injecting the group V and group III precursors at a constant rate until the nitride thin film 315 with a desired thickness is obtained by maintaining the selected ratio of the group V precursor to the group III precursor. At this time, the growing of the nitride layer may be performed after changing process conditions in the middle if necessary. For example, the nitride layer is grown at a first pressure, and then grown at a second pressure higher than the first pressure.

Figure 7:
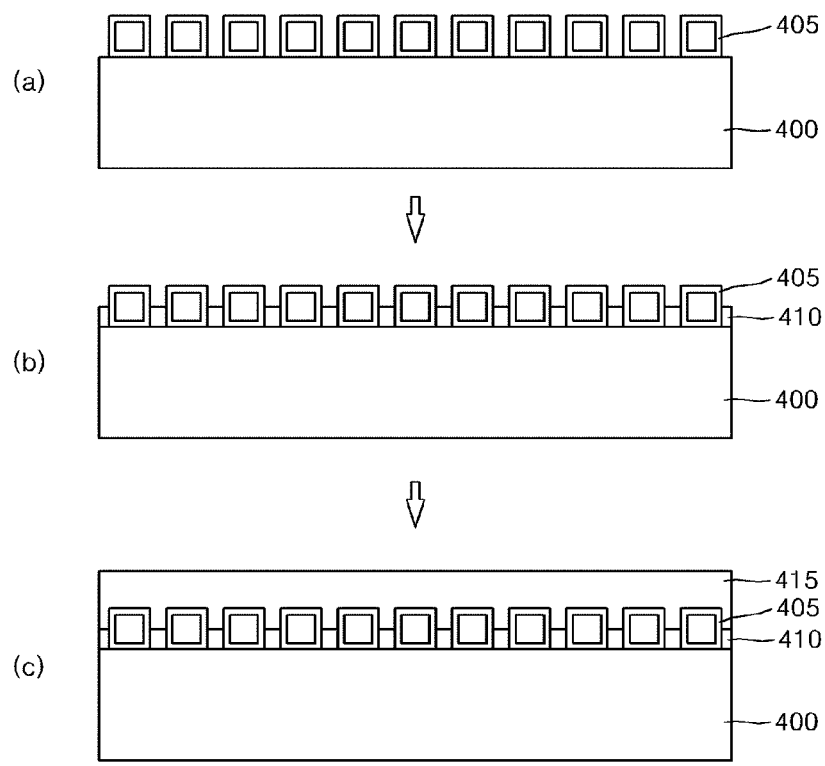
FIG. 7 is a cross-sectional view illustrating a nitride thin film structure and a method of forming the same according to another exemplary embodiment.

FIG. 7 is a cross-sectional view illustrating a nitride thin film structure and a method of forming the same according to another exemplary embodiment.

Herein, after coating hexahedral hollow structures 405 on a substrate 400 as illustrated in FIG. 7(a), a buffer layer 410 is formed according to FIG. 7(b). A nitride thin film 415 is grown over the buffer layer 410 as illustrated in FIG. 7(c). Only difference from the case of FIG. 6 is that a shape of the hollow structure 405 is hexahedron, and the others may be referred to the descriptions relating to FIG. 6 as they are.

Figure 8:
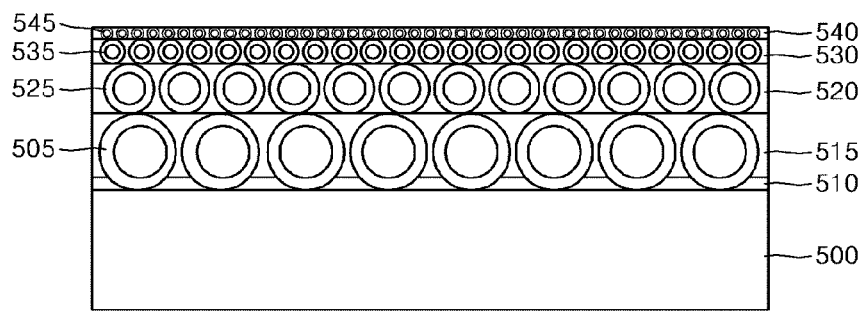
FIG. 8 is a cross-sectional view illustrating a nitride thin film structure and a method of forming the same according to another exemplary embodiment.

FIG. 8 is a cross-sectional view illustrating a nitride thin film structure and a method of forming the same according to another exemplary embodiment.

Referring to FIG. 8, first hollow structures 505 are coated on a substrate 500, and sum of thicknesses of buffer layer 510 and first nitride thin film 515 is made to be more than a size of the first hollow structure 505. Second follow structures, which have smaller hollow sizes than the first hollow structures 505, are coated on the first hollow structures 505. Thickness of a second nitride thin film 520 is made to be more than a size of the second hollow structure 525. Third follow structures, which have smaller hollow sizes than the second hollow structures 525, are coated a on the second hollow structures 525. Thickness of a third nitride thin film 530 is made to be more than a size of the third hollow structure 535. Fourth hollow structures, which have smaller hollow sizes than the third hollow structures 535, are coated on the third hollow structures 535. Thickness of a fourth nitride thin film 540 is made to be more than a size of the fourth hollow structure 545. FIG. 8 illustrates that the sum of the thicknesses of the buffer layer 510 and first nitride thin film 515 is the same as the size of the hollow structure 505; the thickness of the second nitride thin film 520 is the same as the size of the second hollow structure 525; the thickness of the third nitride thin film 530 is the same as the size of the third hollow structure 535; and the thickness of the fourth nitride thin film 540 is the same as the size of the fourth hollow structure 545.

The method of the present invention also includes a method that adjusts difference in refractive index by adjusting the hollow size while a multi-layer of the hollow structures is stacked like in a method of further including hollow structures between the nitride thin films as well as the nitride thin film is made to be multi-layered like the above. As shown in FIG. 8, if the hollow size of the hollow structure near the substrate 500 is made to be larger, the refractive index will be gradually decreased as a ratio occupied by the hollows with respect to a predetermined area is increased. Since there is an effect of increasing light extraction efficiency depending on the changes in the refractive index, high power can be expected during manufacturing the thin film structure into a device such as a light emitting diode (LED). Also, since it is similar to the case where ELO masks are formed in many times, there is an effect in which defect density is decreased as moving toward an upper layer of the nitride thin films. Therefore, there is an advantage that the process becomes very simple as compared to the ELO in which actual deposition and patterning should be repeated.

Particularly, in the present exemplary embodiment, it is preferable that the hollow structures 505, 525, 535 and 545 are formed of materials in which refractive indexes thereof are different from the nitride thin films 515, 520, 530 and 540. Silica, alumina, and titania materials or metallic materials may be particularly used.

Although four layers of the hollow structure and four layers of the nitride film are illustrated in FIG. 8, the object intended in the present exemplary embodiment can be achieved if the numbers of layers of the hollow structure and nitride thin film are two or more.

Figure 9:
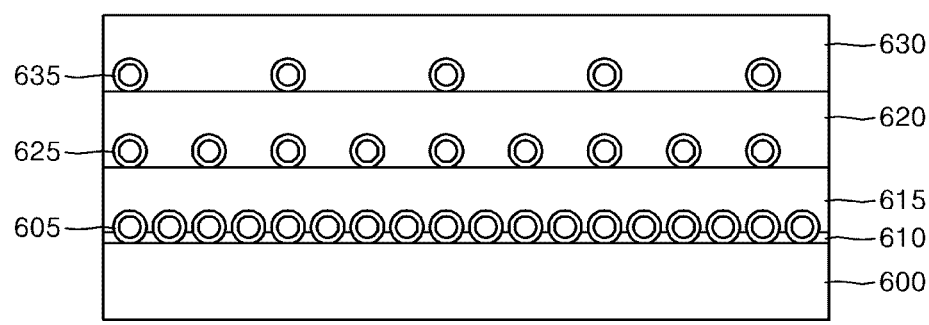
FIG. 9 is a cross-sectional view illustrating a nitride thin film structure and a method of forming the same according to another exemplary embodiment.

FIG. 9 is a cross-sectional view illustrating a nitride thin film structure and a method of forming the same according to another exemplary embodiment.

FIG. 9 illustrates a method that adjusts the difference in the refractive index while stacking hollow structures as illustrated in FIG. 8. However, it is a method that adjusts the coating density larger as moving toward a substrate 600 while the hollow size of the hollow structure is constantly maintained unlike FIG. 8.

Referring to FIG. 9, first hollow structures 605 are coated on a substrate 600 at a first coating density, and sum of thicknesses of buffer layer 610 and first nitride thin film 615 is made to be more than a size of a hollow structure 605.

Second hollow structures 625 are coated at a second coating density which is smaller coating density than the first coating density although the second hollow structure 625 has the same size as the first hollow structure 605. Thickness of a second nitride thin film 620 is made to be more than the size of the second hollow structure 625.

Third hollow structures 635 are coated at a third coating density which is smaller coating density than the second coating density although the third hollow structure 635 has the same size as the first and second hollow structures 605 and 625. Thickness of a third nitride thin film 630 is made to be more than the size of the third hollow structure 635. Adjustment of the coating density like the foregoing description can be achieved through changes of coating conditions such as a solvent concentration is controlled when the hollow structures are coated by dispersing in the solvent or electric charge strength is controlled when the substrate and hollow structure have opposite electric charges to each other.

As shown in FIG. 9, if the coating density of the hollow structure near the substrate 600 is made to be increased, the refractive index will be decreased as closer toward the substrate 600. Although three layers of the nitride thin film are illustrated in the drawing, the object intended in the present exemplary embodiment can be achieved if the numbers of layers of the hollow structure and nitride thin film are two or more.

Figure 10:
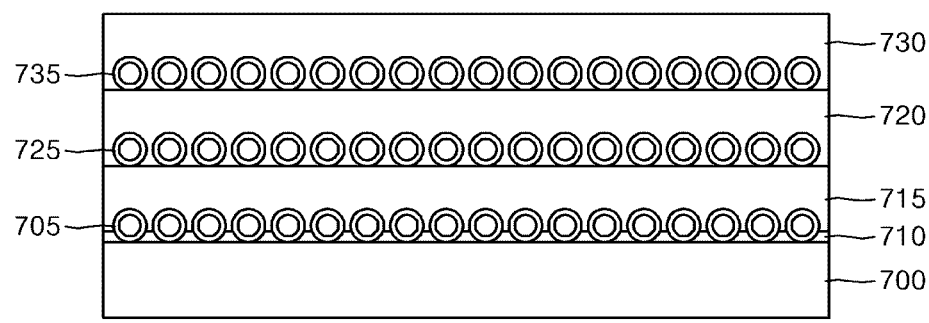
FIG. 10 is a cross-sectional view illustrating a nitride thin film structure and a method of forming the same according to another exemplary embodiment.

FIG. 10 is a cross-sectional view illustrating a nitride thin film structure and a method of forming the same according to another exemplary embodiment.

Referring to FIG. 10, first hollow structure 705 are coated on a substrate 700, and sum of thicknesses of buffer layer 710 and first nitride thin film 715 is made to be more than a size of the first hollow structure 705.

Second hollow structures 725 are coated on the first nitride thin film 715 with the same size and coating density as the first hollow structures 705. Thickness of a second nitride thin film 720 is made to be more than a size of the second hollow structure 725.

Third hollow structures 735 are coated on the second nitride thin film 720 with the same size and coating density as the first and second hollow structures 705 and 725. Thickness of a third nitride thin film 730 is made to be more than a size of the third hollow structure 735.

In the present exemplary embodiment, there is also an effect in which defect density decreases as moving toward an upper layer of the nitride thin films similar to the case where the ELO masks are formed in many times.

Meanwhile, the structures and methods, in which the nitride films are grown by directly coating the hollow structures having hollow particle states on the substrates, were introduced in the foregoing embodiments. However, a method is also possible, in which after coating core-shell structures with filled cores, a nitride thin film is grown by making hollow structures with the core-shell structures by removing the core portions through a predetermined post-processing. This will be described in detail with reference to FIG. 11.

First, as shown in FIG. 11(a), a plurality of core-shell structures 805 is prepared. The core-shell structures 805 may be prepared in a solution state by dispersing in an appropriate solvent such as distilled water or alcohol. The core-shell structure 805 is composed of a core portion 805a having a predetermined size and a shell portion 805b having an outer wall shape which surrounds the core portion 805a. Preferably, the core portion 805a should be composed of a material which can be easily removed by decomposing by heat or through a chemical reaction with a gas including oxygen or a solvent. The shell portion 805b should be composed of an appropriate material because it will constitute the outer wall of the hollow structure by remaining after removing the core portion 805a. Preferably, the core portion 805a is a bead manufactured with an organic material or an inorganic material. The shell portion 805b is a material which can withstand to remain even against heating or chemical reactions for removing the core portion 805a and is generally applicable to a semiconductor process. Also, the shell portion 805b is a material that includes pores through which the gas for the chemical reaction or the solvent for removing the core portion 805a can infiltrate, for example, a metal oxide. Most preferably, the core portion 805a is a polystyrene head, and the shell portion 805b is at least any one selected from the group consisting of silica, alumina, titania, zirconia, yttria-zirconia, copper oxide, and tantalum oxide. It is also better that the shell portion 805b is composed of a single layer formed of these metal oxides or of a multi-layered structure having a different kind of a material per layer. Polystyrene bead is low in price and can be easily manufactured by methods such as suspension polymerization, dispersion polymerization, and emulsion polymerization, etc. It may be also manufactured by the method described in detail in Experimental Example 5. It may be used by purchasing the one already made. Silica, alumina, titania, zirconia, yttria-zirconia, copper oxide, and tantalum oxide are materials selected because these materials play a role to relieve stress by remaining in the nitride thin film structure like the present invention as well as these materials are easily formed on the polystyrene head using a reaction such as hydrolysis and condensation polymerization, etc.

Subsequently, referring to FIG. 11(b), the plurality of core-shell structures 805 are coated on a substrate 800.

In this case, since it is also good to make the core-shell structure 805 electrostatically attach on the substrate 800 by allowing the substrate 800 and the core-shell structure 805 to have electric charges different from each other, an electrically charged structure may be selected as the core-shell structure 805 and a polymer electrolyte 806 is coated on the substrate 800 using a method such as spin coating in order for the substrate 800 to have a different electric charge from the core-shell structure 805 to each other.

For example, when the outer wall of the core-shell structure 805 is composed of silica, it naturally has a negative electric charge such that the polymer electrolyte 806 may be coated in order for the substrate 800 to have a positive electric charge. It is preferable for the polymer electrolyte 806 to constitute a multi-layered form in which poly(allylamine hydrochloride) (PAH) 806a and poly(sodium 4-styrene-sulfonate) (PSS) 806b are coated using a layer-by-layer method such as a spin coating method. The PAH 806a having the positive electric charge is made to be positioned at an uppermost layer of the multi-layer as shown in the drawing in order for a surface of the substrate 800 to have the positive electric charge.

The core-shell structures 805 are coated on the substrate 800 by a method such as dip coating or spin coating. Coating density can be adjusted by controlling electric charge strengths of the substrate 800 and the core-shell structure 805 or concentration of the solvent in which the core-shell structures 805 are dispersed. The coating density of the core-shell structures 805 on the substrate 800 may be adjusted to an extent in which about 30% or an entire substrate area is coated.

After the coating of the core-shell structures 805, a hollow structure 805' may be formed by remaining the shell portion 805b of the core-shell structure 805 and removing the core portion 805a as illustrated in FIG. 11(c) using at least any one of heating, a chemical reaction with a gas including oxygen, and a chemical reaction with a solvent. For example, the polystyrene bead may be easily removed by evaporation if heat of about 800° C. is applied when the polystyrene bead is used as the core portion 805a. The polystyrene bead is also easily removed by dissolving even if a solvent such as toluene is applied instead of the heat treatment. Also, if heat is additionally applied in an atmosphere such as the gas including oxygen, for example, a mixed gas of oxygen and nitrogen or a mixed gas of oxygen and argon, the polystyrene bead is removed by dissolving through chemical reactions with these gases.

In some cases, it is possible to use a silica bead as the core portion 805a and use GaN as the shell portion 805b. In this case, an etching solution, which dissolves silica like a hydrofluoric acid (HF) aqueous solution, may be used to remove the core portion 805a.

While making into the hollow structure 805' through an appropriate process, the polymer electrolyte 806 is also removed such that extremely small portion or no portion of the polymer electrolyte 806 may be left on the substrate 800. Before or after the removing of the core portion 805a, post-processes, such as applying heat, chemical treatment using a plasma, a gas, and a chemical solution, or the like, may be further preformed to control mechanical properties such as plastic property and elastic property of the hollow structure 805', etc.

Subsequently, a buffer layer 810 and a nitride thin film 815 are sequentially formed on the substrate 800 having the exposed surface at a periphery of the hollow structure 805' using the method as described with reference to FIGS. 6(b) and 6(c). Then, a nitride thin film structure as illustrated in FIG. 11(d) can be obtained while the polymer electrolyte possibly remained in FIG. 11(c) is all removed by high temperature of growing a layer.

Figure 12:
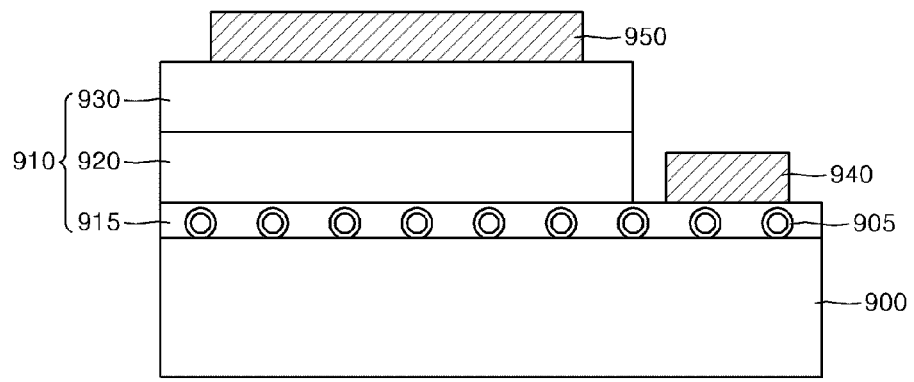
FIG. 12 is a cross-sectional view illustrating a semiconductor device according to the present invention.

FIG. 12 is a cross-sectional view illustrating a semiconductor device according to the present invention.

Referring to FIG. 12, a nitride thin film 910 is formed on a substrate 900, and hollow structures 905 are coated between the substrate 900 and the nitride thin film 910. Thus, the semiconductor device uses a thin film structure according to the present invention, and of course, appropriate patterning is accompanied thereto.

The nitride thin film 910 includes at least an n-type semiconductor layer 915, an active layer 920, and a p-type semiconductor layer 930. A buffer layer may be further included as described above. The n-type semiconductor layer 915 is formed by doping an impurity such as Si, Ge, Se, Te or the like into a material such as GaN, AlGaN, GaInN, and InGaAlN, etc., and is formed through a deposition process such as metal-organic chemical vapor deposition (MOCVD), molecular beam epitaxy (MBE), or hydride vapor phase epitaxy (HVPE). The active layer 920 is a layer for emitting light, which is generally formed by forming a multiple quantum well in which an InGaN layer is a well and a GaN layer is a wall layer. The p-type semiconductor layer 930 is formed by doping an impurity such as Mg, Zn, Be or the like into a material such as GaN, AlGaN, GaInN, and InGaAlN, etc. Electrodes 940 and 950 are formed on the n-type semiconductor layer 915 and the p-type semiconductor layer 930.

Thus, the semiconductor device according to the present invention uses the thin film structure according to the present invention such that a high-quality device can be achieved due to the effects according to the coating of the hollow structures, and a high-power device having improved light extraction efficiency can be achieved according to the adjustment of the refractive index.

Experimental Example 1

A thin film structure as illustrated in FIG. 6 was formed. A sapphire substrate having a (0001) plane as a principal plane was used as a substrate 300. A silica spherical hollow particle of 1 μm size that has a hollow of 0.8 μm size in the middle was used as a hollow structure 305. The silica spherical hollow particles are coated on the (0001) plane of the sapphire substrate using a spin coater for 10 seconds to 3 minutes at 50 to 8000 rpm. Coating density on the sapphire substrate may be adjusted by repeating the coating in many times, wherein the case where the coating is densely performed almost without a gap was calculated as the coating density of 70% or more in an area ratio. Thereafter, the sapphire substrate was put into a MOCVD equipment, and then a GaN buffer layer was grown as a buffer layer 310 at 500-600° C. for 10-50 minutes by injecting trimethylgallium (TMGa) and nitric acid (NH$_3$) at a constant rate after making pressure, temperature and a ratio of NH$_3$ as a group V precursor to TMGa as a group III precursor of a reactor constant. Thereafter, temperature was increased to 1100° C. and a nitride thin film 315 was formed by growing an undoped GaN thin film by injecting the TMGa and NH$_3$ at a constant rate for 2 hours.

Experimental Example 2

A thin film structure as illustrated in FIG. 7 was formed. Using a sapphire substrate having a principal plane of a (0001) plane as a substrate 400, and a silica hexahedral hollow particle of 2 μm size that has a hollow of 1.5 μm size in the middle as a hollow structure 405, coating of 70% or more was performed by a similar condition to the Experimental Example 1. Thereafter, the sapphire substrate was put into a MOCVD equipment and an AlN buffer layer was grown as a buffer layer 410 at 1150° C. for 10-50 minutes. Thereafter, a nitride thin film 415 was formed by growing an undoped GaN thin film to about 4 μm such that the hollow structures 405 were completely covered with the nitride thin film 415.

Experimental Example 3

A thin film structure as illustrated in FIG. 8 was formed. A sapphire substrate having a (0001) plane as a principal plane was used as a substrate 500. Silica spherical hollow particles of 3 μm size that have hollows of 2.5 μm size in the middle were coated as first hollow structures 505. Subsequently, a buffer layer 510 was formed by growing a GaN buffer layer with the same condition as the Experimental Example 1. Thereafter, a first nitride thin film 515 was formed by growing a GaN thin film with the same condition as the Experimental Example 1, wherein sum of thicknesses of the buffer layer 510 and the first nitride thin film 515 was made to be 3 μm, the same as the size of the hollow structure 505.

Next, silica spherical hollow particles of 1.5 μm size that have hollows of 1 μm size in the middle were coated as second hollow structures 525 on the first nitride thin film 515. Thereafter, a second nitride thin film 520 was formed to 1.5 μm by growing a GaN thin film with the same condition as the Experimental Example 1.

Silica spherical hollow particles of 750 nm size that have hollows of 500 nm size in the middle were coated as third hollow structures 535 on the second nitride thin film 520. Thereafter, a third nitride thin film 530 was formed to 750 nm by growing a GaN thin film with the same condition as the Experimental Example 1.

Silica spherical hollow particles of 300 nm size that have hollows of 200 nm size in the middle were coated as fourth hollow structures 545 on the third nitride thin film 530. Thereafter, a fourth nitride thin film 540 was formed to 300 nm by growing a GaN thin film with the same condition as the Experimental Example 1.

Experimental Example 4

A thin film structure as illustrated in FIG. 10 was formed. A sapphire substrate having a (0001) plane as a principal plane was used as a substrate 700, and first hollow structures 705, which are composed of silica spherical hollow particles of 500 nm size that have hollows of 300 nm size in the middle, were coated thereon. A buffer layer 710 and a first nitride thin film 715 were formed by growing a GaN buffer layer and a GaN thin film with the same condition as the Experimental Example 1, respectively, wherein sum of their thicknesses was made to be 1 μm such that the first hollow structures 705 were completely covered with the first nitride thin film 715. After also coating the silica spherical hollow particles of 500 nm size as the second hollow structures 725 thereon at the same coating density as the first hollow structures 705, a second nitride thin film 720 was formed by growing a GaN thin film with the same condition as the Experimental Example 1. Thickness thereof was also made to be 1 μm such that the second hollow structures 725 were completely covered with the second nitride thin film 720. Again, after also coating the silica spherical hollow particles of 500 nm size as the third hollow structures 735 thereon at the same coating density as the first hollow structures 705, a third nitride thin film 730 was formed by growing a GaN thin film to 1 μm with the same condition as the Experimental Example 1.

The semiconductor thin film structures suggested in the present invention can be easily realized into a semiconductor device such as a light emitting diode (LED) by inserting a properly doped epitaxial layer, e.g., making a structure in which a p-type nitride thin film and a n-type nitride thin film are stacked above and under an active layer, respectively, and by accompanying the formation of electrodes, etc. Of course, various devices emitting lights of infrared, ultraviolet, and visible ray regions can be achieved depending on a bandgap of the active layer.

Experimental Example 5

Figure 11:
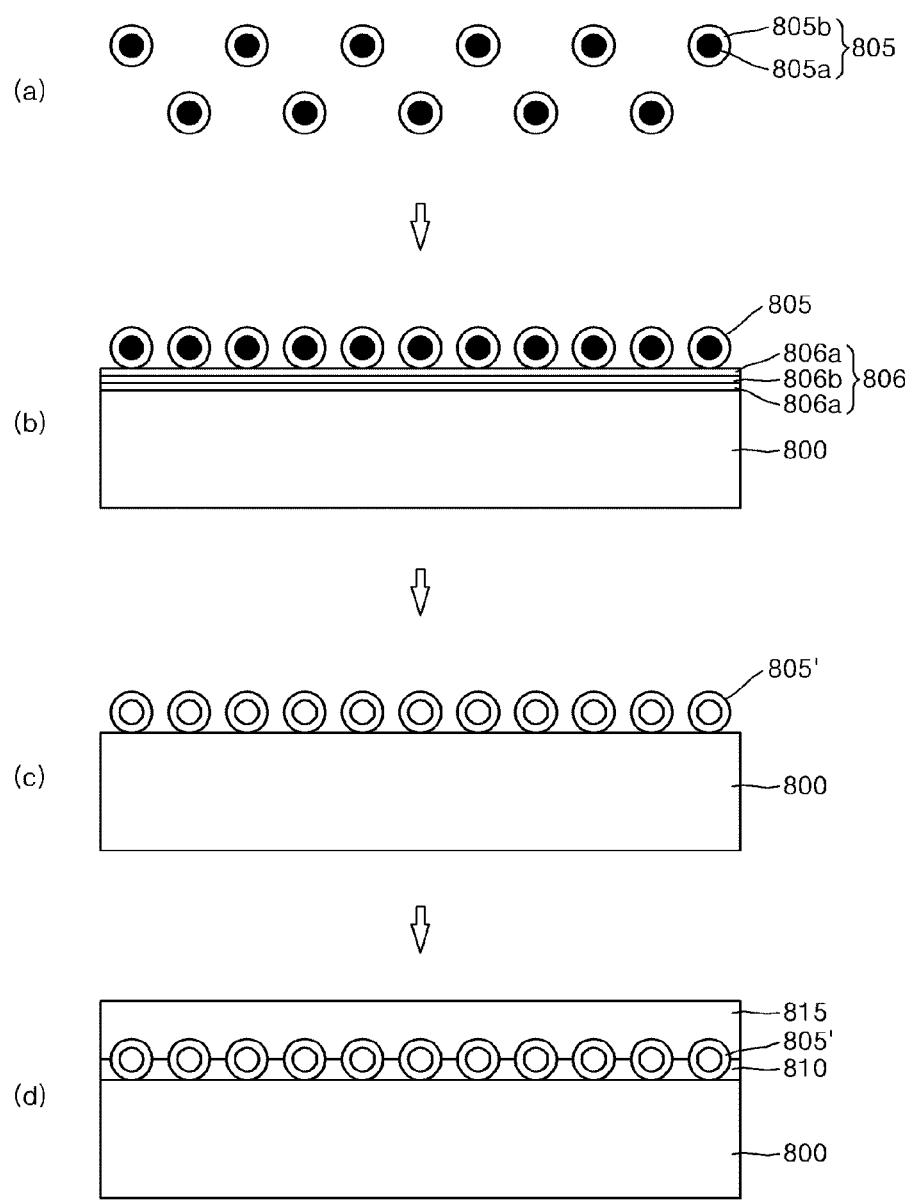
FIG. 11 is a cross-sectional view illustrating a nitride thin film structure and a method of forming the same according to another exemplary embodiment.

A nitride thin film structure was formed using spherical core-shell structures as described with reference to FIG. 11.

First, a polystyrene bead, which will constitute a core portion 805a by acting as a template of a spherical core-shell structure 805, was synthesized. After putting 20 ml of distilled water, 2 ml of styrene monomer, 0.06 g of 2,2'-azobis (2-methylpropionamidine)dihydrochloride (AIBA) as a crosslinking agent, and 0.25 g of polyvinylpyrrolidone (PVP) as a stabilizer into a spherical reactor of 100 ml and stirring, reaction was performed at a temperature of 70° C. for 24 hours under a nitrogen atmosphere. After finishing the reaction, reactants were precipitated using a centrifuge and filtered, and cleaned using ethanol. A size of the polystyrene bead synthesized by this method was 185 nm, and the polystyrene beads having various sizes of 150 nm to 2 μm could be synthesized if a mixing ratio of reaction substances was changed.

The synthesized polystyrene beads were made to a polystyrene beads dispersed solution by re-dispersing in distilled water or 50 ml of an alcohol solvent. Spherical core-shell structures 805 having about 230 nm sizes were manufactured by forming shell portions 805b composed of silica with 22 nm thickness on surfaces of the styrene beads by reacting at room temperature for 3 hours after putting 1 ml of the polystyrene beads dispersed solution, 7.5 ml of distilled water, 25 ml of isopropanol, 0.1 ml of ammonia water (29%), and 0.5 ml of tetra ethyl ortho silicate (TEOS) into the reactor. The spherical core-shell structure 805 thus obtained has a negative electric charge on the surface itself by the silica shell. A solution was prepared by well dispersing the spherical core-shell structures 805 in distilled water or an alcohol solvent.

A sapphire substrate was selected as a substrate 800 on which the spherical core-shell structures 805 are coated, and a surface of the substrate 800 was coated with a polymer electrolyte 806 by a layer-by-layer method in order to have a positive electric charge on the surface. A multi-layer was formed by alternatingly coating with PAH 806a and PSS 806b as shown in FIG. 11, wherein the PAH 806a having a positive electric charge was made to be positioned at an uppermost layer of the multi-layer.

Coating was performed to obtain about 30% of coating density of the core-shell structures 805 on the substrate 800 by spin coating or dip coating the substrate 800 with the spherical core-shell structures 805 dispersed solution. Since the spherical core-shell structures 805 and the substrate 800 have opposite electric charges to each other and attach by electrostatic force, the once attached spherical core-shell structures 805 are not detached from the substrate 800. Thereafter, the substrate 800 coated with hollow structures 805' was obtained by removing the polystyrene beads templates in the spherical core-shell structures 805 by heating the substrate 800 at 800° C.

The substrate 800 coated with the hollow structures 805' was put into a MOCVD equipment and GaN was grown as a buffer layer 810. The GaN buffer layer was grown by injecting 22 sccm of TMGa as a group III precursor and NH$_3$ as a group V precursor into a reactor through individual lines at a flow rate of 2 slm for 13 minutes, respectively. At this time, temperature and pressure of the reactor were 1080° C. and 300 torr, respectively. After growing the GaN buffer layer, a GaN thin film was grown in-situ as a nitride thin film 815 for 1 hour. At this time, 45 sccm of TMGa as the group III precursor and NH$_3$ as the group V precursor were also injected into the reactor through the individual lines at a flow rate of 1.8 slm, respectively, and the temperature and pressure of the reactor were maintained with the same as the growth of the GaN buffer layer.

Figure 13:
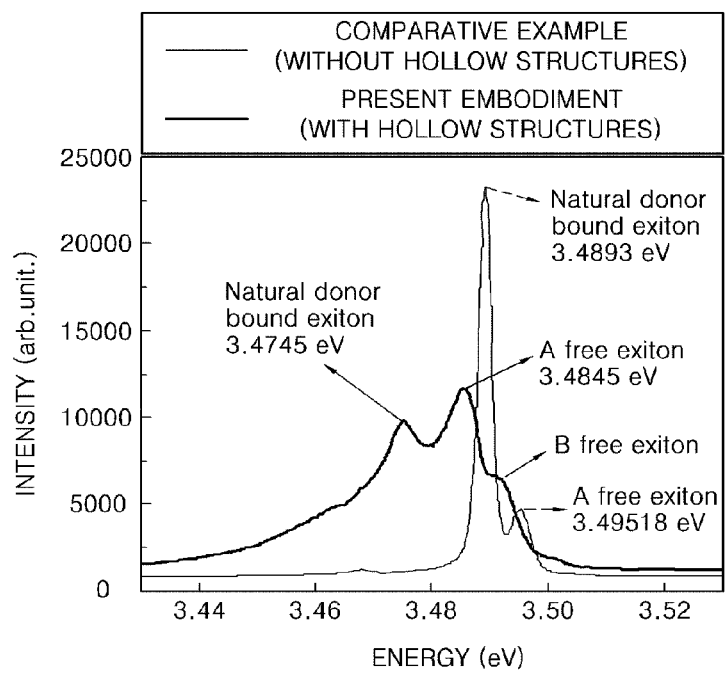
FIGS. 13 and 14 are Comparative Examples showing the results of photoluminescence (PL) measured from a GaN thin film grown without hollow structures and a GaN thin film grown according to the present invention.

FIG. 13 is the results of photoluminescence (PL) measured from the GaN thin film thus grown. When comparing with the case of a GaN thin film grown without hollow structures as a Comparative Example, it can be seen that PL peaks in the case of the present invention (Experimental Example 5) are red-shifted. Therefore, it can be confirmed that stress received by the GaN thin film was greatly reduced in the present invention.

Experimental Example 6

After obtaining the substrate 800 coated with the hollow structures 805' by processing with the same condition as the Experimental Example 5, the substrate 800 was put into an MOCVD equipment and the GaN buffer layer 810 was grown with the same condition as the Experimental Example 5. A GaN thin film was grown thereon as the nitride thin film 815 for 1 hour, wherein it was grown at 50 torr that is a lower pressure condition than the Experimental Example 5.

Figure 14:
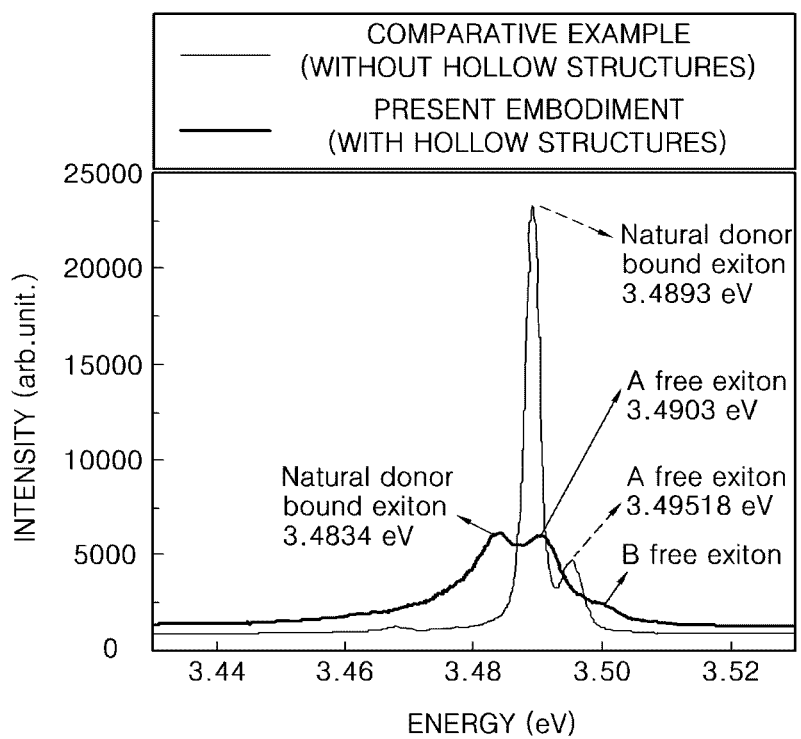

FIG. 14 is the results of photoluminescence (PL) measured from the GaN thin film thus grown. When comparing with the case of a GaN thin film grown without hollow structures as a Comparative Example, it can be seen that PL peaks in the case of the present invention (Experimental Example 6) are red-shifted. Therefore, it can be confirmed that stress received by the GaN thin film was greatly reduced in the present invention.

Experimental Example 7

After obtaining the substrate 800 coated with the hollow structures 805' by processing with the same condition as the Experimental Example 5, the substrate 800 was put into a MOCVD equipment and the GaN buffer layer 810 and the GaN nitride thin film 815 were grown with the same condition as the Experimental Example 5, wherein growth time of the nitride thin film 815 was extended to 2 hours different from the Experimental Example 5.

Figure 15:
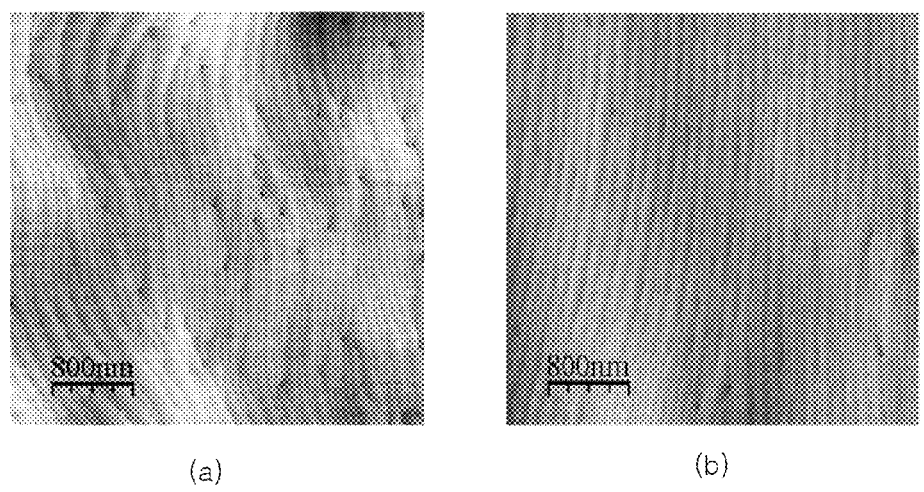
FIGS. 15 and 16 are Comparative Examples showing atomic force microscope (AFM) images of a GaN thin film grown without hollow structures and a GaN thin film grown according to the present invention.

FIG. 15(a) is a Comparative Example showing an atomic force microscope (AFM) image of a GaN thin film grown without hollow structures, and FIG. 15(b) is an AFM image of a GaN thin film according to the present invention (Experimental Example 7). When comparing two images, it can be understood that defects such as dislocations or the like are greatly reduced in the case of the present invention, and surface condition of the GaN thin film is also very good.

Experimental Example 8

After growing the nitride thin film 815 like in the Experimental Example 6, a GaN thin film was additionally grown by increasing the reactor pressure to 300 torr.

Figure 16:
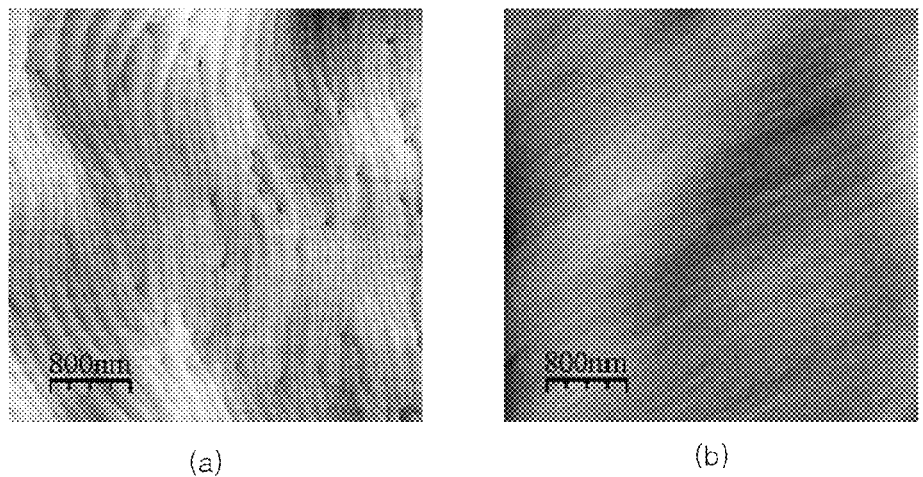

FIG. 16(a) is a Comparative Example showing an atomic force microscope (AFM) image of a GaN thin film grown without hollow structures, and FIG. 16(b) is an AFM image of a GaN thin film according to the present invention (Experimental Example 8). When comparing two images, it can be understood that defects such as dislocations or the like are greatly reduced in the case of the present invention, and surface condition of the GaN thin film is also very good.

Figure 17:
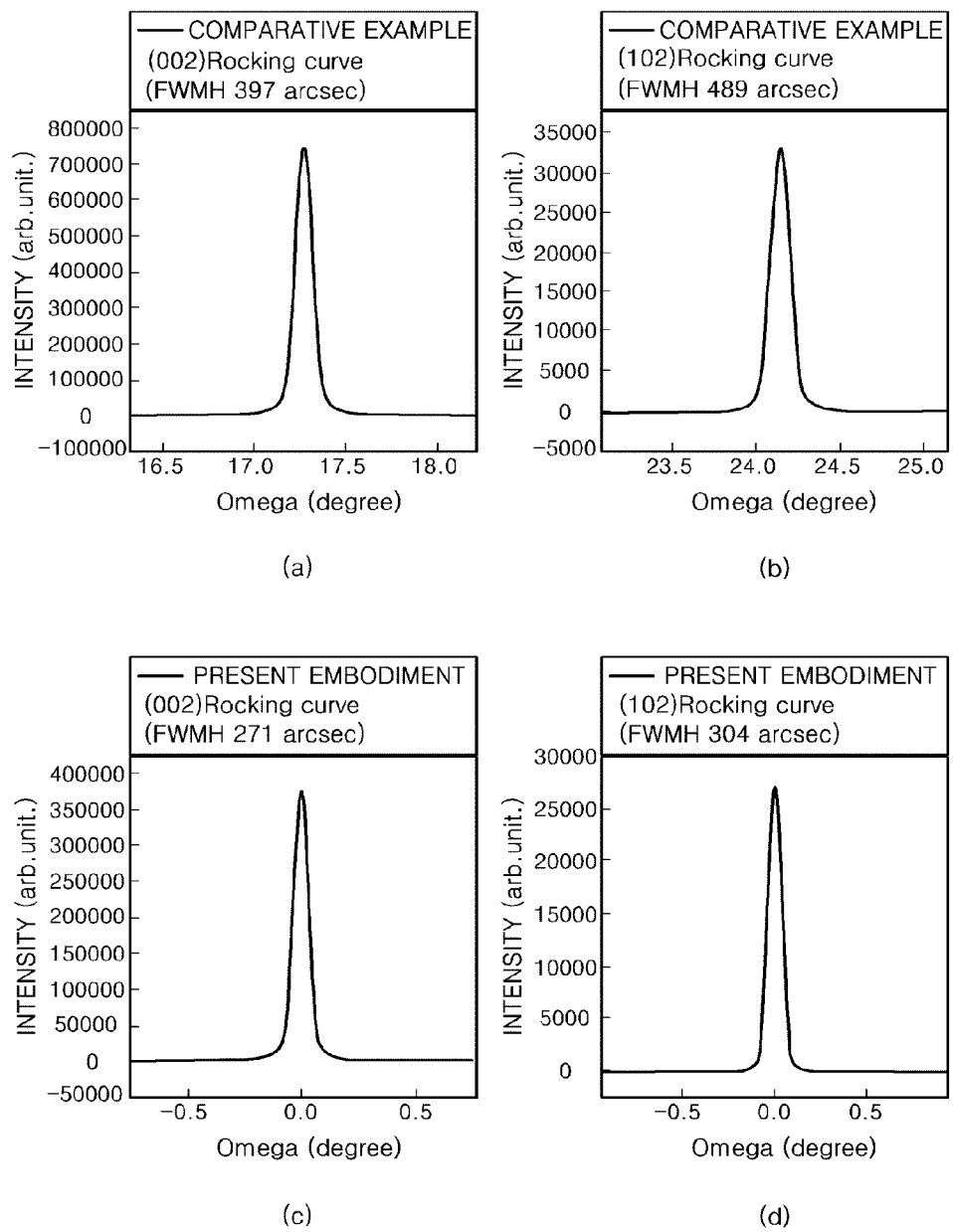
FIG. 17 is a Comparative Example showing the results of X-ray diffraction rocking curves (XRC) measured from a GaN thin film grown without hollow structures and a GaN thin film grown according to the present invention.

FIG. 17(a) is a Comparative Example showing the result of X-ray diffraction rocking curves (XRC) measured from a (002) plane of a GaN thin film grown without hollow structures, FIG. 17(b) is a Comparative Example showing the XRC result of a (102) plane of GaN grown without hollow structures, FIG. 17(c) is the XRC result of a (002) plane of GaN grown according to the present invention (Experimental Example 8), FIG. 17(d) is the XRC result of a (102) plane of GaN grown according to the present invention. When comparing the XRC results, it can be understood that crystallinity is also increased in the case of the present invention.

Although the nitride thin film structure and method of forming the same have been described with reference to the specific embodiments, they are not limited thereto. Therefore, it will be readily understood by those skilled in the art that various modifications and changes can be made thereto without departing from the spirit and scope of the present invention defined by the appended claims.

The invention claimed is:

1. A semiconductor thin film structure, comprising:
a non-nitride substrate;
a plurality of particles coated on the substrate, wherein each particle comprises an inner cavity; and
a nitride thin film formed over the substrate by growing over the substrate exposed at a periphery of the particles to be combined over the particles,
wherein the substrate includes a material having a thermal expansion coefficient being larger than that of the nitride thin film, the particles are compressed by the nitride thin film and warpage of the substrate is prevented by the compressing of the particles during a cooling process after the forming of the nitride thin film.

2. The semiconductor thin film structure of claim 1, further comprising a buffer layer between the substrate and the nitride thin film.

3. The semiconductor thin film structure of claim 1 or 2, wherein the nitride thin film has two or more layers.

4. The semiconductor thin film structure of claim 3, further comprising a plurality of particles coated between two nitride thin film layers, wherein each of the particle which is coated between the two nitride thin film layers includes the inner cavity.

5. The semiconductor thin film structure of claim 4, wherein the particles formed closer to the substrate have larger size inner cavities than the particles formed farther away from the substrate.

6. The semiconductor thin film structure of claim 5, wherein each particle comprises a material having a refractive index different from that of the nitride thin film.

7. The semiconductor thin film structure of claim 4, wherein the particles formed closer to the substrate have larger coating density than the particles formed farther away from the substrate, when the size of the each particle is uniform.

8. The semiconductor thin film structure of claim 7, wherein the particles comprise a material having a refractive index different from that of the nitride thin film.

9. The semiconductor thin film structure of claim 1 or 2, wherein thermal expansion coefficient of the substrate is larger than that of the nitride thin film, and the particles are compressed by the nitride thin film.

10. A semiconductor device, comprising:
a non-nitride substrate;
a plurality of particles coated on the substrate, wherein each particle comprises an inner cavity; and
a semiconductor thin film structure comprising a nitride thin film formed over the substrate on which the particles are formed, by growing over the substrate exposed at a periphery of the particles to be combined over the particles,
wherein the substrate includes a material having a thermal expansion coefficient being larger than that of the nitride thin film, the particles are compressed by the nitride thin film and warpage of the substrate is prevented by the compressing of the particles during a cooling process after the forming of the nitride thin film.

* * * * *